US012426273B2

(12) United States Patent
Ahn et al.

(10) Patent No.: US 12,426,273 B2
(45) Date of Patent: Sep. 23, 2025

(54) MAGNETORESISTANCE MEMORY DEVICE AND METHOD FOR MANUFACTURING MAGNETORESISTANCE MEMORY DEVICE

(71) Applicant: Kioxia Corporation, Tokyo (JP)

(72) Inventors: Hyung-woo Ahn, Seongnam-si (KR); Young Min Eeh, Yokohama Kanagawa (JP); Tadaaki Oikawa, Seoul (KR); Taiga Isoda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 182 days.

(21) Appl. No.: 18/337,576

(22) Filed: Jun. 20, 2023

(65) Prior Publication Data

US 2024/0099019 A1 Mar. 21, 2024

(30) Foreign Application Priority Data

Sep. 21, 2022 (JP) ................................. 2022-150194

(51) Int. Cl.
*H10B 61/00* (2023.01)
*H10N 50/01* (2023.01)
(Continued)

(52) U.S. Cl.
CPC ............. *H10B 61/10* (2023.02); *H10N 50/01* (2023.02); *H10N 50/10* (2023.02); *H10N 50/80* (2023.02)

(58) Field of Classification Search
CPC ........ H10B 61/10; H10N 50/01; H10N 50/10; H10N 50/80
(Continued)

(56) References Cited

U.S. PATENT DOCUMENTS 8,716,818 B2 5/2014 Yoshikawa et al.
10,263,178 B2 4/2019 Sawada et al.
(Continued)

FOREIGN PATENT DOCUMENTS

JP 2013016587 A 1/2013
JP 2022049883 A 3/2022
(Continued)

OTHER PUBLICATIONS

Kim, et al., "Breakthrough of Selector Technology for cross-point 25-nm ReRAM", IEEE International Electron Devices MeetinQ, 2017.
(Continued)

*Primary Examiner* — Fernando Hidalgo
(74) *Attorney, Agent, or Firm* — Holtz, Holtz & Volek PC

(57) ABSTRACT

A magnetoresistance memory device includes a lower electrode, a barrier layer, a variable resistance layer, an upper electrode, and a first layer stack. The lower electrode contains one of amorphous carbon and amorphous carbon nitride. The barrier layer is provided on the lower electrode and contains one of tungsten nitride (WN) and silicon tungsten nitride (WSiN). The variable resistance layer is provided on the barrier layer and contains a variable resistance material. The upper electrode is provided on the variable resistance layer and contains one of amorphous carbon and amorphous carbon nitride. The first layer stack is provided on the upper electrode and includes a first ferromagnetic layer, a second ferromagnetic layer, and an insulating layer between the first ferromagnetic layer and the second ferromagnetic layer.

15 Claims, 14 Drawing Sheets

(51) Int. Cl.
*H10N 50/10* (2023.01)
*H10N 50/80* (2023.01)

(58) Field of Classification Search
USPC .......................................................... 365/158
See application file for complete search history.

(56) References Cited

U.S. PATENT DOCUMENTS

| | | | |
|---|---|---|---|
| 10,388,343 | B2 | 8/2019 | Oikawa et al. |
| 10,468,170 | B2 | 11/2019 | Eeh et al. |
| 10,553,647 | B2 | 2/2020 | Grobis et al. |
| 10,840,434 | B2 | 11/2020 | Kitagawa et al. |
| 10,873,021 | B2 | 12/2020 | Eeh et al. |
| 11,127,445 | B2 | 9/2021 | Eeh et al. |
| 11,201,189 | B2 | 12/2021 | Eeh et al. |
| 11,201,192 | B2 | 12/2021 | Jeong et al. |
| 11,217,288 | B2 | 1/2022 | Sawada et al. |
| 11,316,095 | B2 | 4/2022 | Oikawa et al. |
| 11,329,215 | B2 | 5/2022 | Sawada et al. |
| 11,404,098 | B2 | 8/2022 | Isoda et al. |
| 11,495,740 | B2 | 11/2022 | Isoda et al. |
| 11,538,856 | B2 * | 12/2022 | Dixit ................ H01F 10/3259 |
| 11,563,168 | B2 | 1/2023 | Sawada et al. |
| 2007/0253118 | A1 * | 11/2007 | Hayakawa ............. H10B 61/22 360/324.1 |
| 2016/0284994 | A1 | 9/2016 | Soncini et al. |
| 2018/0076262 | A1 | 3/2018 | Eeh et al. |
| 2018/0240845 | A1 * | 8/2018 | Yang .................. G11C 11/1675 |
| 2018/0277745 | A1 | 9/2018 | Oikawa et al. |
| 2020/0098985 | A1 | 3/2020 | Trinh et al. |
| 2020/0136032 | A1 * | 4/2020 | Liu ........................ H10N 50/85 |
| 2020/0185455 | A1 * | 6/2020 | Yang .................. G11C 11/1675 |
| 2020/0294567 | A1 | 9/2020 | Oikawa et al. |
| 2020/0303632 | A1 | 9/2020 | Watanabe et al. |
| 2021/0287727 | A1 * | 9/2021 | Tsubata ................. G11C 11/161 |
| 2022/0085279 | A1 | 3/2022 | Sawada et al. |
| 2022/0085281 | A1 | 3/2022 | Kanaya |
| 2022/0093146 | A1 | 3/2022 | Akiyama et al. |
| 2022/0093848 | A1 | 3/2022 | Kitagawa et al. |
| 2022/0199136 | A1 | 6/2022 | Isoda et al. |
| 2022/0238792 | A1 | 7/2022 | Sawada et al. |
| 2022/0302205 | A1 | 9/2022 | Oikawa et al. |
| 2022/0302372 | A1 | 9/2022 | Oikawa et al. |
| 2023/0026414 | A1 | 1/2023 | Isoda et al. |
| 2023/0062011 | A1 | 3/2023 | Oikawa et al. |
| 2023/0072970 | A1 | 3/2023 | Isoda et al. |
| 2023/0083008 | A1 | 3/2023 | Igarashi et al. |

FOREIGN PATENT DOCUMENTS

| | | |
|---|---|---|
| JP | 2022051040 A | 3/2022 |
| TW | 201644080 A | 12/2016 |
| TW | 202013710 A | 4/2020 |
| TW | 202226628 A | 7/2022 |

OTHER PUBLICATIONS

Seo, et al., "First demonstration of full integration and characterization of 4F 2 1 S 1 M cells with 45 nm of pitch and 20 nm of MTJ size", International Electron Devices Meeting, 2022.

U.S. Appl. No. 17/842,417, First Named Inventor: Tadaaki Oikawa; Title: "Magnetic Memory Device"; Filed: Jun. 16, 2022.

U.S. Appl. No. 17/942,365, First Named Inventor: Eiji Kitagawa; Title: "Magnetic Memory Device"; Filed: Sep. 12, 2022.

* cited by examiner

MAGNETORESISTANCE MEMORY DEVICE AND METHOD FOR MANUFACTURING MAGNETORESISTANCE MEMORY DEVICE

CROSS-REFERENCE TO RELATED APPLICATIONS

This application is based upon and claims the benefit of priority from Japanese Patent Application No. 2022-150194, filed Sep. 21, 2022, the entire contents of which are incorporated herein by reference.

FIELD

Embodiments described herein relate generally to a magnetoresistance memory device and a method for manufacturing the magnetoresistance memory device.

BACKGROUND

A magnetoresistance memory device system is known as one type of memory device.

DETAILED DESCRIPTION

In general, according to one embodiment, a magnetoresistance memory device includes a lower electrode, a barrier layer, a variable resistance layer, an upper electrode, and a first layer stack. The lower electrode contains one of amorphous carbon and amorphous carbon nitride. The barrier layer is provided on the lower electrode and contains one of tungsten nitride (WN) and silicon tungsten nitride (WSiN). The variable resistance layer is provided on the barrier layer and contains a variable resistance material. The upper electrode is provided on the variable resistance layer and contains one of amorphous carbon and amorphous carbon nitride. The first layer stack is provided on the upper electrode and includes a first ferromagnetic layer, a second ferromagnetic layer, and an insulating layer between the first ferromagnetic layer and the second ferromagnetic layer.

Embodiments will now be described with reference to the figures. In the following description, components with substantially the same functionalities and configurations will be referred to with the same reference symbols, and repeated descriptions may be omitted.

The figures are schematic, and the relation between the thickness and the area of a plane of a layer and the ratio of thicknesses of layers may differ from those in actuality. The figures may include components which differ in relations and/or ratios of dimensions in different figures. The entire description of a particular embodiment applies to another embodiment unless an explicit mention is made otherwise, or an obvious elimination is involved. Each embodiment illustrates a device and a method for materializing the technical idea of that embodiment, and the technical idea of each embodiment does not limit the quality of the material, shape, structure, arrangement of components, etc. to those that will be described below.

In the specification and the accompanying claims, a phrase of a particular first component being "coupled" to another second component includes the first component being coupled to the second component either directly or via one or more components which are always or selectively conductive.

The embodiments will be described using an xyz orthogonal coordinate system. In the description below, the term "below" as well as the terms derived therefrom and related thereto refer to a position having a smaller coordinate on the z-axis, and "above" as well as the terms derived therefrom and the terms related thereto refer to a position having a larger coordinate on the z-axis.

<1> First Embodiment

<1-1> Structure (Configuration)

The memory device according to the first embodiment will now be described.

<1-1-1> Overall Structure

Figure 1:
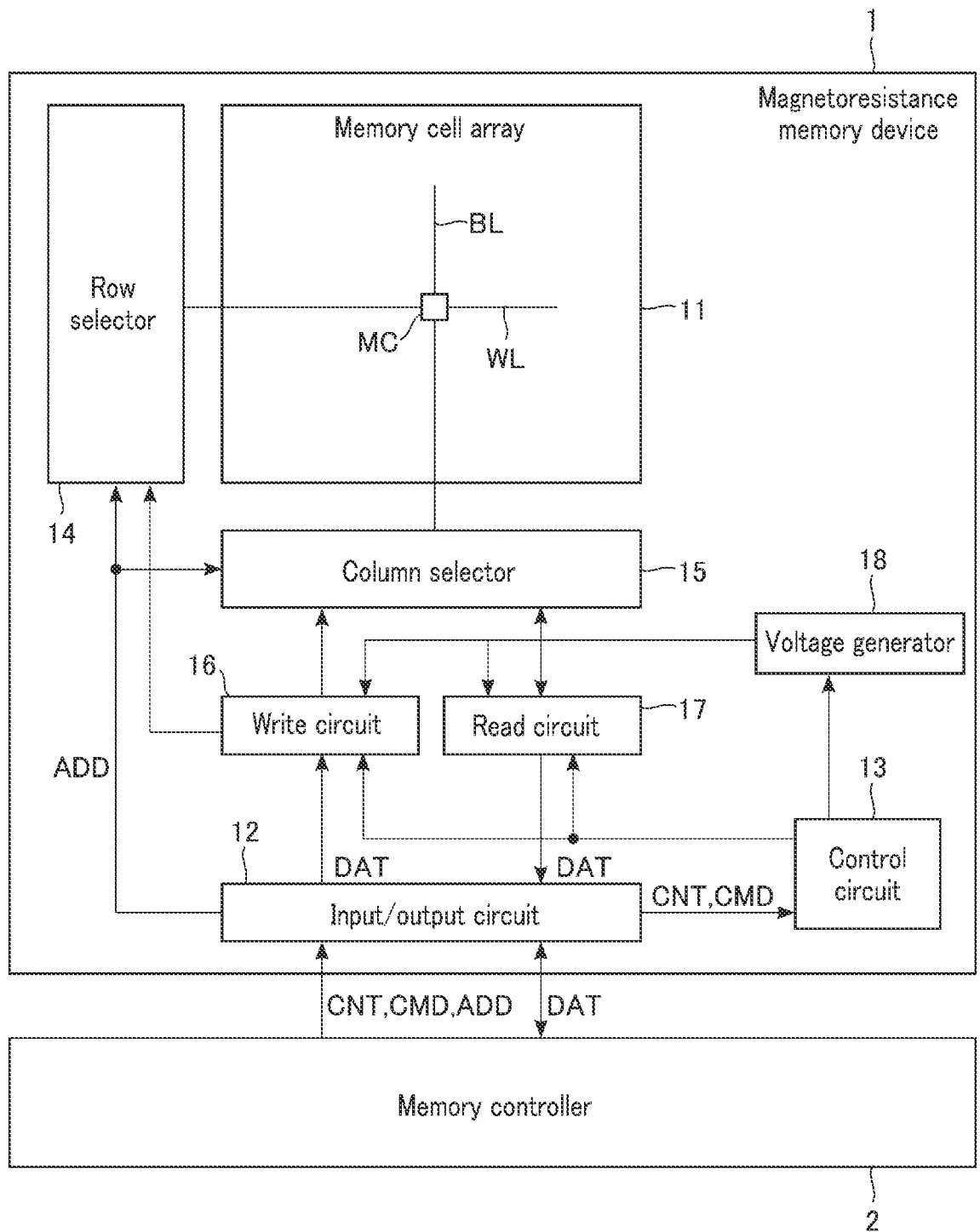
FIG. 1 is a block diagram showing a configuration example of a magnetoresistance memory device according to a first embodiment.

FIG. 1 shows functional blocks of a memory device according to a first embodiment. As shown in FIG. 1, the magnetoresistance memory device 1 is controlled by a memory controller 2. The magnetoresistance memory device 1 is a memory device which stores data using ferromagnets. The magnetoresistance memory device 1 includes a memory cell array 11, an input/output circuit 12, a control circuit 13, a row selector 14, a column selector 15, a write circuit 16, a read circuit 17, and a voltage generator 18.

The memory cell array 11 is a set of arranged memory cells MC. The memory cells MC can store data in a non-volatile manner. In the memory cell array 11, word lines WL and bit lines BL are located. Each memory cell MC is coupled to a single word line WL and a single bit line BL. Each word line WL is associated with a row. Each bit line BL is associated with a column. Selection of a single row and selection of a single column specify a single memory cell MC.

The input/output circuit 12 is a circuit which performs input and output of data and signals. The input and output circuit 12 receives a control signal CNT, a command CMD, an address signal ADD, and data (write data) DAT from a memory controller 2. The input and output circuit 12 transmits data (read data) DAT to the memory controller 2.

The row selector 14 receives the address signal ADD from the input and output circuit 12, and brings a single word line WL associated with the row specified by the received address signal ADD into a selected state.

The column selector 15 receives the address signal ADD from the input and output circuit 12, and brings one or more bit lines BL associated with the column specified by the received address signal ADD into a selected state.

The control circuit 13 receives the control signal CNT and the command CMD from the input/output circuit 12. The control circuit 13 controls the write circuit 16 and the read circuit 17 based on a control instructed by the control signal CNT and the command CMD. Specifically, the control circuit 13 supplies voltages used for data write to the write circuit 16 during the writing of data to the memory cell array 11. Further, the control circuit 13 supplies voltages used for data read to the read circuit 17 during the reading of data from the memory cell array 11.

The write circuit 16 receives write data DAT from the input/output circuit 12 and supplies the voltages for data write to the row selector 14 and the column selector 15 based on the control by the control circuit 13 and the write data DAT.

The read circuit 17 uses the voltages used for data reading based on the control of the control circuit 13, to determine data stored in the memory cells MC. The determined data is supplied to the input and output circuit 12 as the read data DAT. The read circuit 17 includes a sense amplifier.

The voltage generator 18 generates voltages used for data read and write based on the control by the control circuit 13. The voltage generator 18 supplies the generated voltages to the write circuit 16 and the read circuit 17.

<1-1-2> Circuit Configuration of Memory Cell Array

Figure 2:
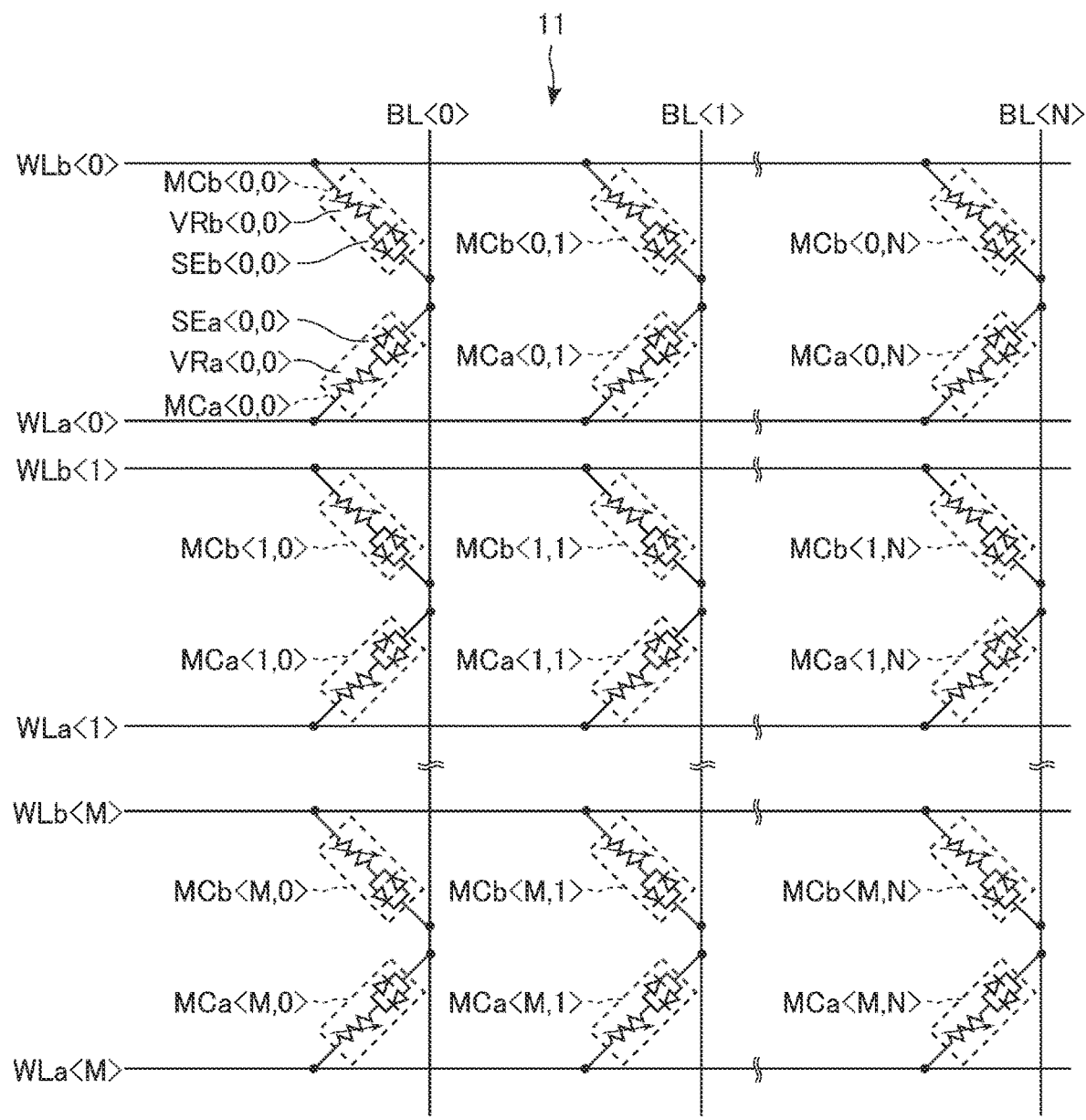
FIG. 2 is a circuit diagram showing an example of a circuit configuration of a memory cell array of the magnetoresistance memory device according to the first embodiment.

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1>, . . . , and WLb<M>), where M is an integer equal to or lager than 1.

The memory cell array 11 also includes (N+1) bit lines BL (BL<0>, BL<1>, . . . , and BL<N>), where N is an integer equal to or lager than 1.

Each memory cell MC (MCa and MCb) has a first node and a second node. Each memory cell MC is coupled, at its first end, to a single word line WL, and is coupled, at its second node, to a single bit line BL. More specifically, the memory cells MCa encompass memory cells MCa<$\alpha,\beta$> for all combinations of a and R, where a is every integer equal to or greater than 0 and equal to or less than M, and $\beta$ is every integer equal to or greater than 0 and equal to or less than N, and the memory cell MCa<$\alpha,\beta$> is coupled between the word line WLa<$\alpha$> and the bit line BL<$\beta$>. Similarly, the memory cells MCb encompass memory cells MCb<$\alpha,\beta$>, for all combinations of a and R, where a is every integer equal to or greater than 0 and equal to or less than M, and $\beta$ is every integer equal to or greater than 0 and equal to or less than N, and the memory cell MCb<$\alpha,\beta$> is coupled between the word line WLb<$\alpha$> and the bit line BL<P.

More specifically, the memory cell MCa<$\alpha,\beta$> includes a magnetoresistance effect element VRa<$\alpha,\beta$> and a switching element SEa<$\alpha,\beta$> for all combinations of a and where a is every integer equal to or greater than 0 and equal to or smaller than M, and $\beta$ is every integer equal to or greater than 0 and equal to or less than N. Moreover, the memory cell MCb<$\alpha$, $\beta$> includes a magnetoresistance effect element VRb<$\alpha$, $\beta$> and a switching element SEb<$\alpha$, $\beta$> for all combinations of a and R, where a is every integer equal to or greater than 0 and equal to or smaller than M, and $\beta$ is every integer equal to or greater than 0 and equal to or smaller than N.

In each memory cell MC, the magnetoresistance effect element VR and the switching element SE are coupled in series. The magnetoresistance effect element VR is coupled to a single word line WL, and the switching element SE is coupled to a single bit line BL.

The magnetoresistance effect element VR can switch between a low-resistance state and a high-resistance state. The magnetoresistance effect element VR can store 1-bit data, using the difference in the two resistance states.

The switching element SE is an element for selecting the memory cell MC in which this switching element SE is included. The switching element SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to the that of switching between the high-resistance state and the low-resistance state based on the magnitude of the voltage applied in the first direction, with respect to a second direction opposite to the first direction. A switching element is a bidirectional switching element.

By turning on or off the switching element, it is possible to perform control on whether or not to supply a current to a magnetoresistance effect element VR coupled to the switching element, namely, whether or not to select the magnetoresistance effect element VR.

<1-1-3> Structure of Memory Cell Array

Figure 3:
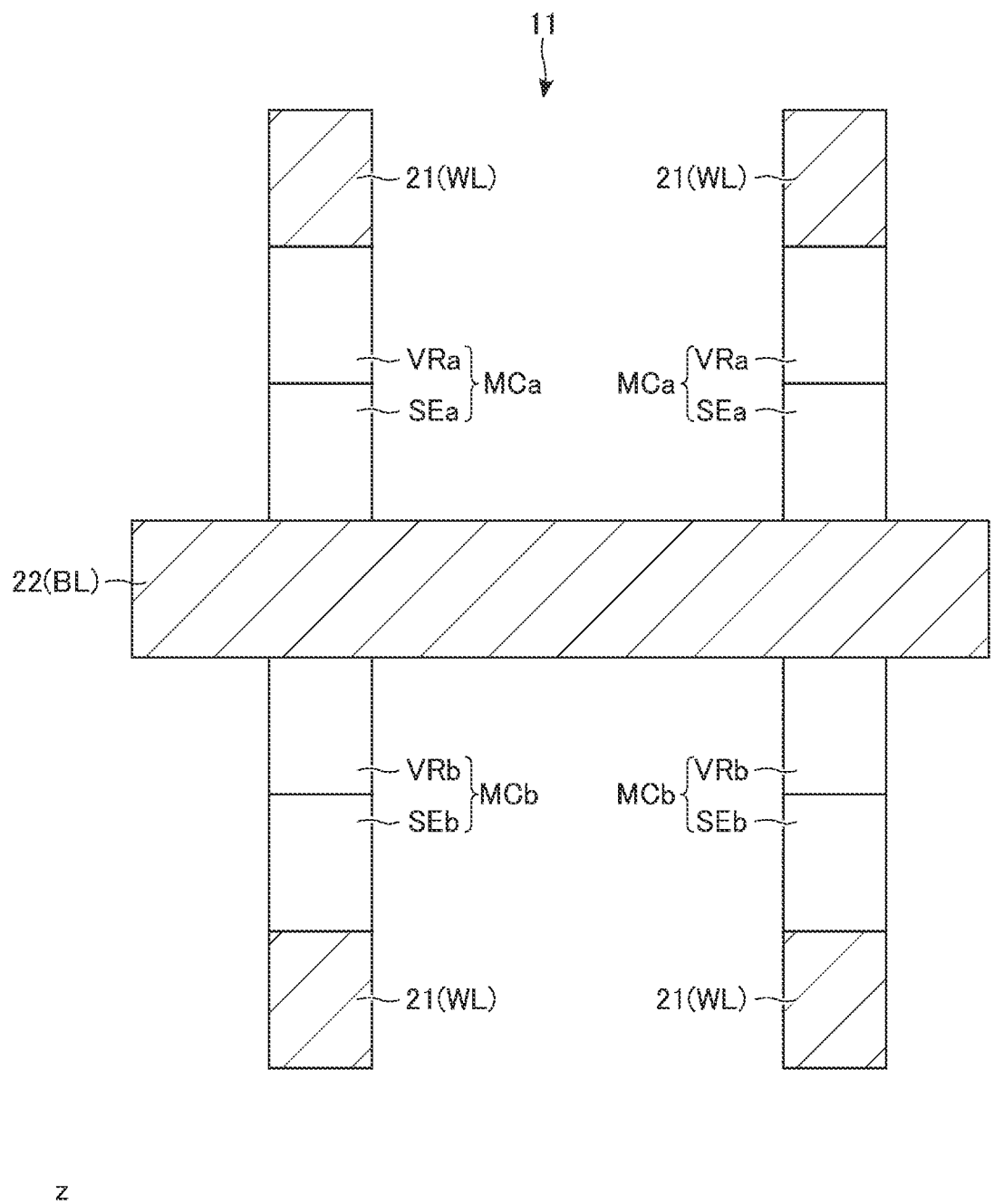
FIG. 3 illustrates an example of a sectional structure of part of the memory cell array of the magnetoresistance memory device according to the first embodiment.
Figure 4:
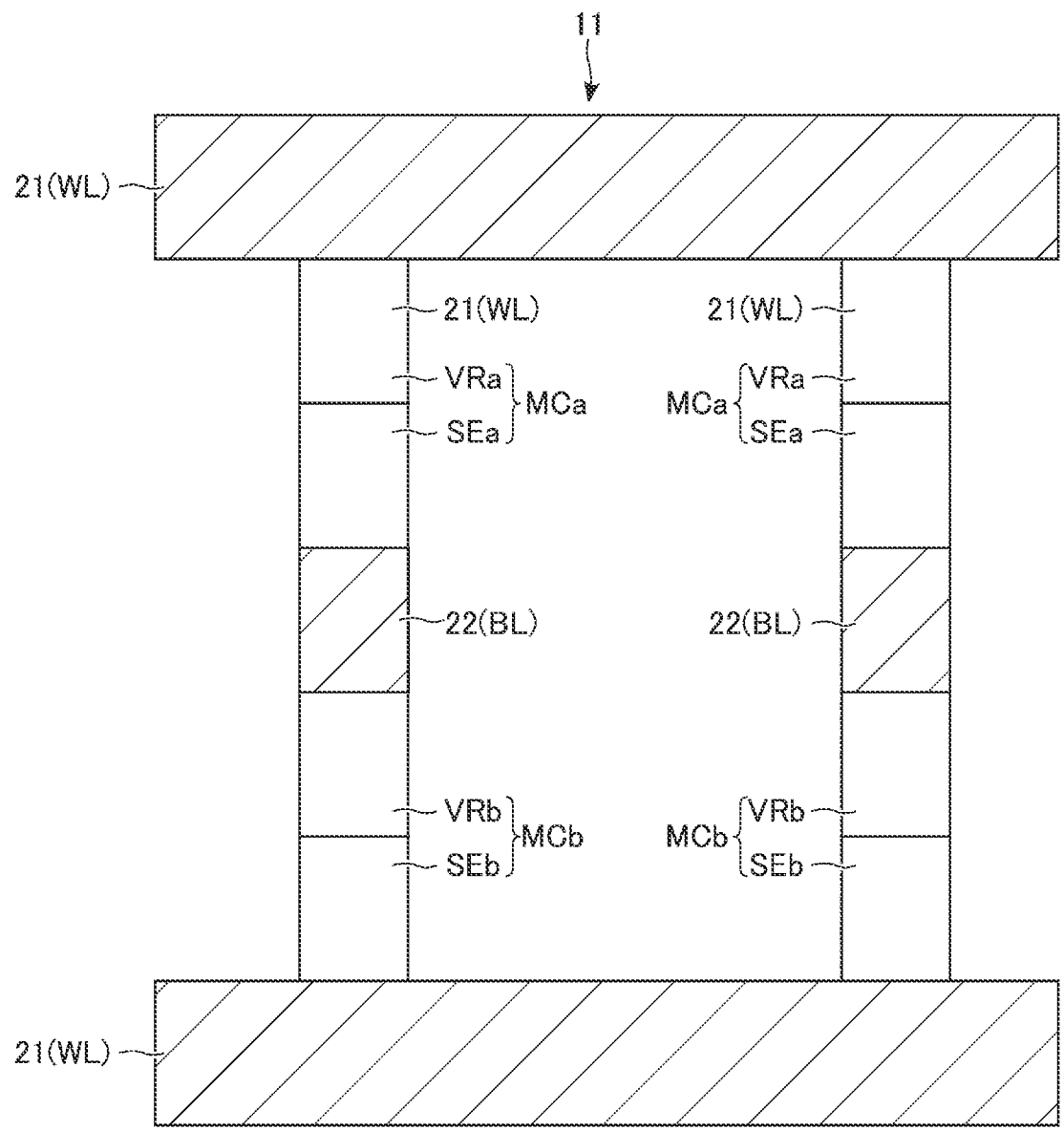
FIG. 4 illustrates an example of a sectional structure of part of the memory cell array of the magnetoresistance memory device according to the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane.

As shown in FIGS. 3 and 4, conductors 21 are provided above the semiconductor substrate (not shown). The conductors 21 extend along the y-axis and are aligned along the x-axis. Each conductor 21 serves as a single word line WL.

Each conductor 21 is coupled, at its upper surface, to the lower surfaces of memory cells MCb. Each memory cell MCb has, for example, a circular shape in the xy-plane. The memory cells MCb are aligned along the y-axis on each conductor 21, and this arrangement provides a matrix of memory cells MCb over the xy-plane. Each memory cell MCb includes a structure that serves as a switching element SEb and a structure that serves as a magnetoresistance effect element VRb. The structure that serves as a switching element SEb and the structure that serves as a magnetoresistance effect element VRb each have one or more layers, as will be described later.

Conductors 22 are provided above the memory cells MCb. The conductors 22 extend along the x-axis and are aligned along the y-axis. Each conductor 22 is coupled, at its lower surface, to the upper surfaces of memory cells MCb aligned along the x-axis. Each conductor 22 serves as a single bit line BL.

Each conductor 22 is coupled, at its upper surface, to the lower surfaces of memory cells MCa. Each memory cell MCa has, for example, a circular shape in the xy-plane. The memory cells MCa are aligned along the x-axis on each conductor 22, and this arrangement provides a matrix of memory cells MCa over the xy-plane. Each memory cell MCa includes a structure that serves as a switching element SEa and a structure that serves as a magnetoresistance effect element VRa. The structure that serves as a switching element SEa and the structure that serves as a magnetoresistance effect element VRa each have one or more layers, as will be described later.

A further conductor 21 is provided on the upper surfaces of memory cells MCa aligned along the y-axis.

The structure from the layer of the lowermost conductor 21 to the layer of the memory cell MCa shown in FIGS. 3 and 4 is repeatedly provided along the z axis, thereby making it possible to implement the memory cell array 11 shown in FIG. 2. The memory cell array 11 further includes an interlayer insulator in a region where none of the conductors 21 and 22 and the memory cell MC are provided.

<1-1-4> Structure of Memory Cell

Figure 5:
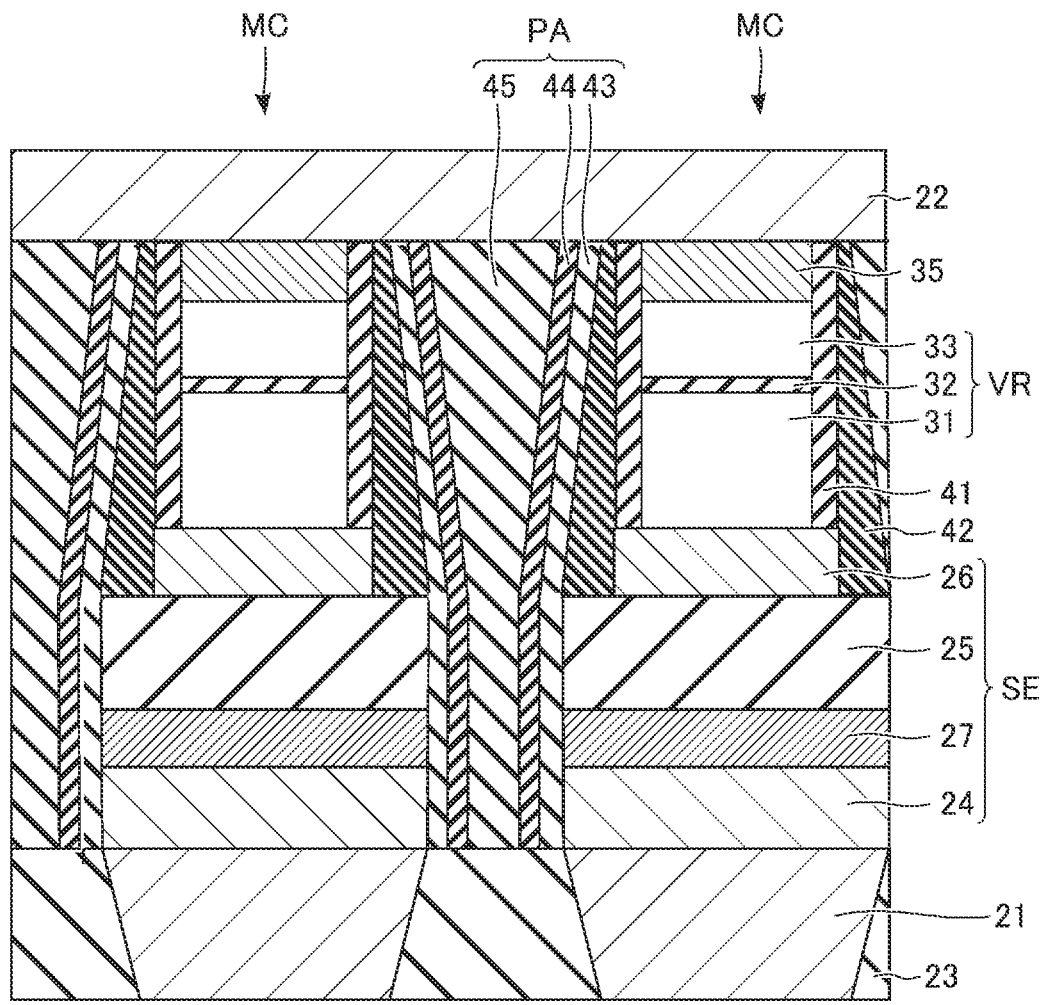
FIG. 5 illustrates an example of a sectional structure of a memory cell of the magnetoresistance memory device according to the first embodiment.

FIG. 5 shows a cross section of an example of a structure of a memory cell of the first embodiment. FIG. 5 shows a structure from the layer where a certain conductor 21 is located to the layer where a conductor 22 located thereabove along the z-axis. That is, the memory cell MC shown in FIG. 5 corresponds to the memory cell MCb.

As shown in FIG. 5, an interlayer insulator 23 is formed above a semiconductor substrate (not shown). A conductor 21 is provided within the interlayer insulator 23. A memory cell MC is located on the upper surface of each conductor 21. An interlayer insulator PA is provided between every two memory cells MC. The interlayer insulator PA will be described later.

Each memory cell MC includes a switching element SE, a magnetoresistance effect element VR, a hard mask 35, and side wall insulators 41 and 42. The memory cell MC may include additional layers.

Each switching element SE may be located on the upper surface of a single conductor 21 and tapered on its side surface. The switching element SE may be formed in the shape of a truncated cone, for example.

The switching element SE includes at least a lower electrode 24, a barrier layer 27, a variable resistance material (layer) 25 and an upper electrode 26. The lower electrode 24 is located on the upper surface of the conductor 21. The barrier layer 27 is located on the upper surface of the lower electrode 24. The variable resistance material 25 is located on the upper surface of the barrier layer 27. The upper electrode 26 is located on the upper surface of the variable resistance material 25.

The lower electrode 24 contains, for example, amorphous carbon (a-C) or amorphous carbon nitride (a-CN) or substantially consists of a-C or a-CN. The amorphous carbon (a-C) includes, for example, a graphite structure and diamond-like.

In the present specification and claims, the expression "substantially formed of" (or, "consists substantially of") and a similar kind of expression that include "substantially" therein are intended to mean that unintended impurities are allowed to be contained in components mentioned after "substantially formed of." Examples of the unintended impurities include atoms of elements contained in a gas used during the manufacturing process of the magnetoresistance memory device 1, and atoms of elements diffused from the surroundings of other components that are "substantially formed" of something to the component that is "substantially formed" of something.

The barrier layer 27 contains, for example, tungsten nitride (WN) or silicon tungsten nitride (WSiN) or substantially consists of WN or WSiN.

The variable resistive material 25 is, for example, a switching element between two terminals, the first of which corresponds to one of the upper or lower surface of the variable resistive material 25, the second of which corresponds to the other one of the upper or lower surface of the variable resistive material 25. When a voltage applied between the two terminals is smaller than a threshold, the switching element is in a "high-resistance" state, e.g., in an electrically non-conductive state. When a voltage applied between the two terminals is equal to or greater than the threshold, the switching element is in a "low-resistance" state, e.g., in an electrically conductive state.

The variable resistance material 25 is made of a material constituted by an insulator and contains a dopant introduced by ion injection. The insulator contains, for example, an oxide and $SiO_2$ or a material substantially consisting of $SiO_2$. The dopant contains, for example, arsenic (As) and germanium (Ge). The foregoing materials are shown as an example of the variable resistance material 25 that constitutes a switching element between two terminals. A material capable of switching operation at a current that is smaller than the operating current of the magnetoresistance effect element VR is selected and used as appropriate.

The upper electrode 26 contains, for example, a-C or a-CN or substantially consists of a-C or a-CN. The a-C includes, for example, graphite structure or diamond-like.

A single magnetoresistance effect element VR is located on the upper surface of each upper electrode 26. The magnetoresistance effect element VR may be tapered on its side surface. The magnetoresistance effect element VR may have the shape of a truncated cone, for example.

Each magnetoresistance effect element VR exhibits a tunnel magnetoresistance effect. In this embodiment and a modification to be described later, it will be described as an element including a magnetic tunnel junction (MTJ). Specifically, the magnetoresistance effect element VR includes a ferromagnetic layer 31, an insulating layer 32, and a ferromagnetic layer 33. As an example, as shown in FIG. 5, the insulating layer 32 is on the upper surface of the ferromagnetic layer 31, and the ferromagnetic layer 33 is on the lower surface of the insulating layer 32.

The ferromagnetic layer 31 is a layer of a material showing a ferromagnetic property. The ferromagnetic layer 31 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The direction of magnetization of the ferromagnetic layer 31 is intended to remain unchanged even when data is read or written in the magnetoresistance memory device 1. The ferromagnetic layer 31 can serve as a so-called "reference layer". The ferromagnetic layer 31 may include a plurality of layers.

The insulating layer 32 is a layer of an insulator. The insulating layer 32 contains or substantially consists of, for example, magnesium oxide (MgO), and serves as a so-called "tunnel barrier".

The ferromagnetic layer 33 is a layer of a material showing a ferromagnetic property. The ferromagnetic layer 33 contains or substantially consists of, for example, cobalt iron boron (CoFeB) or boride iron (FeB). The ferromagnetic layer 33 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The magnetization direction of ferromagnetic layer 33 can be changed by data writing, and the ferromagnetic layer 33 can serve as a so-called "storage layer".

When the magnetization direction of ferromagnetic layer 33 is parallel to the magnetization direction of ferromagnetic layer 31, magnetoresistance effect element VR is in a state of having low resistance. When the magnetization direction of ferromagnetic layer 33 is anti-parallel to the magnetization direction of ferromagnetic layer 31, the magnetoresistance effect element VR is in a state of having a resistance higher than that in the case where the magnetization directions of the ferromagnetic layers 31 and 33 are anti-parallel to each other.

When a certain magnitude of write current flows from the ferromagnetic layer 33 to the ferromagnetic layer 31, the magnetization direction of ferromagnetic layer 33 becomes parallel to the magnetization direction of ferromagnetic layer 31. In contrast, when another magnitude or write current flows from the ferromagnetic layer 31 to the ferromagnetic layer 33, the magnetization direction of ferromagnetic layer 33 becomes anti-parallel to the magnetization direction of ferromagnetic layer 31.

Magnetoresistance effect element VR may include additional layers.

The hardmask 35 is located on the upper surface of the magnetoresistance effect element VR, for example the upper surface of the ferromagnetic layer 33. The hardmask 35 is made of a conductor, and contains or substantially consists of TiN, for example.

The side surfaces of the upper electrode 26, the magnetoresistance element VR and hard mask 35 are covered by the sidewall insulator 41. The side surfaces of the sidewall insulator 41 and upper electrode 26 are covered with the sidewall insulator 42.

The sidewall insulator 42 has an etching rate for reactive ion etching (RIE) which is lower than that for RIE of at least one component included in the switching element SE, as described below.

Hereinafter, the etching rate for RIE may be referred to as an RIE etching rate. The sidewall insulator 42 has an RIE etching rate that is lower than that of each of the variable resistance material 25, barrier layer 27 and lower electrode 24 which are included in the switching element SE.

Since the sidewall insulator 42 has an RIE etching rate as described above, it may contain or substantially consist of a first material with properties to be described below. More specific examples of the first material include oxides of hafnium (Hf), aluminum (Al), scandium (Sc), gadolinium (Gd), tantalum (Ta) and yttrium (Y). That is, the examples of the first material include hafnium oxide ($HfO_2$), aluminum oxide ($Al_2O_3$), scandium oxide ($Sc_2O_3$), gadolinium oxide ($Gd_2O_3$), tantalum oxide ($Ta_2O_5$) and yttrium oxide ($Y_2O_3$).

The sidewall insulator 41 may have a material similar to that of the sidewall insulator 42.

A conductor 22 is located on the upper surface of the hard mask 35 of each of the memory cells MC aligned along the y-axis.

In that part of a region from the upper surface of the interlayer insulator 23 to the upper surface of the hard mask 35 where no element is provided, an interlayer insulator PA is provided. In other words, an interlayer insulator PA is provided between two adjacent memory cells MC. For example, the interlayer insulator PA may be so configured that layers extending along the z-axis and containing or substantially consisting of silicon nitride (SiN) and layers extending along the z-axis and containing or substantially consisting of silicon oxide ($SiO_2$) are arranged alternately along the x-axis.

For example, the interlayer insulator PA includes interlayer insulators 43 to 45. The interlayer insulator 43 is provided on the side surfaces of the sidewall insulator 42, variable resistance material 25, barrier layer 27 and lower electrode 24. The interlayer insulator 44 is provided on the side surface of the interlayer insulator 43. The interlayer insulator 45 is embedded between adjacent interlayer insulators 44. The interlayer insulators 43 to 45 contain or substantially consist of SiN, $SiO_2$ and SiN, respectively. Alternatively, the interlayer insulators 43 to 45 contain or substantially consist of $SiO_2$, SiN and $SiO_2$, respectively.

<1-2> Manufacturing Method

Figure 6:
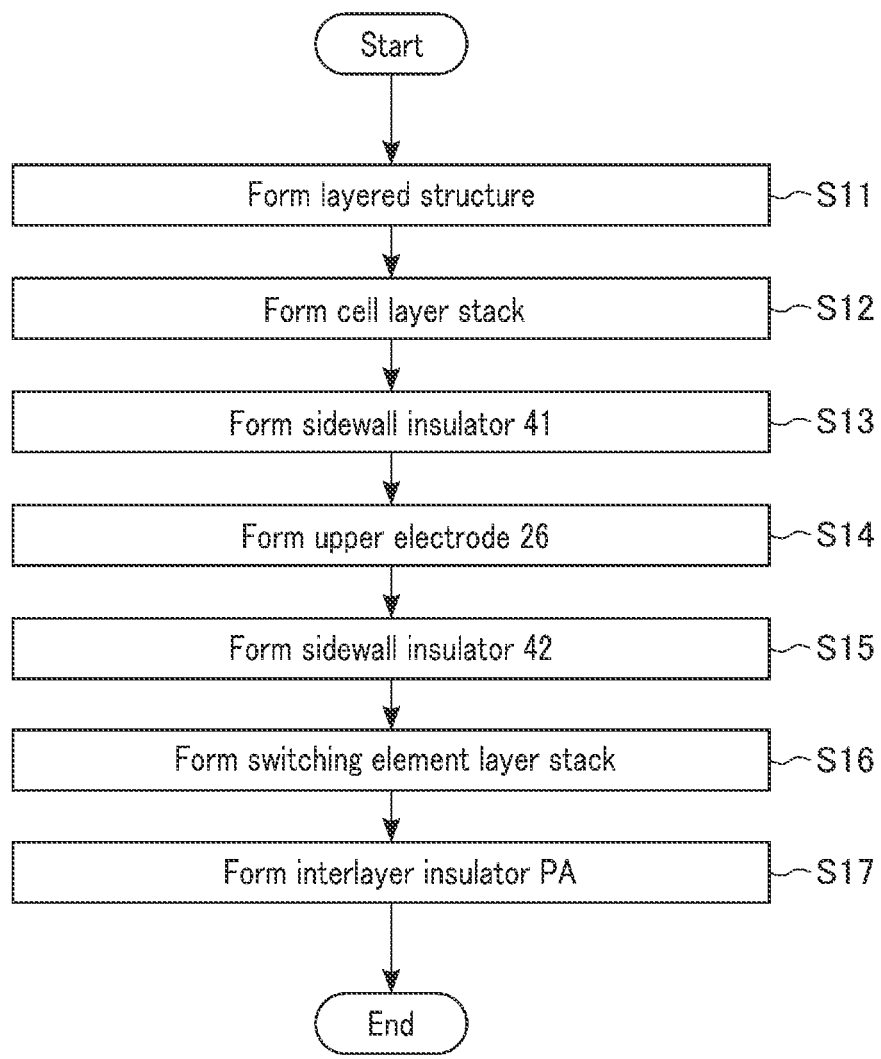
FIG. 6 is a flowchart showing an example of a manufacturing process of the magnetoresistance memory device according to the first embodiment.

FIG. 6 is a flowchart showing an example of a manufacturing process of the magnetoresistance memory device 1 according to the first embodiment. FIGS. 7 to 13 illustrate in order examples of a sectional structure of part of the magnetoresistance memory device 1 according to the first embodiment, which is in production. FIGS. 7 to 13 illustrate sectional structure of the same region as that illustrated in FIG. 5. Referring to FIG. 6 as appropriate, an example of the manufacturing process of the magnetoresistance memory device 1 according to the first embodiment will be described below. In the manufacturing method, for example, steps S11 to S19 are executed in order, as illustrated in FIG. 6.

Figure 7:
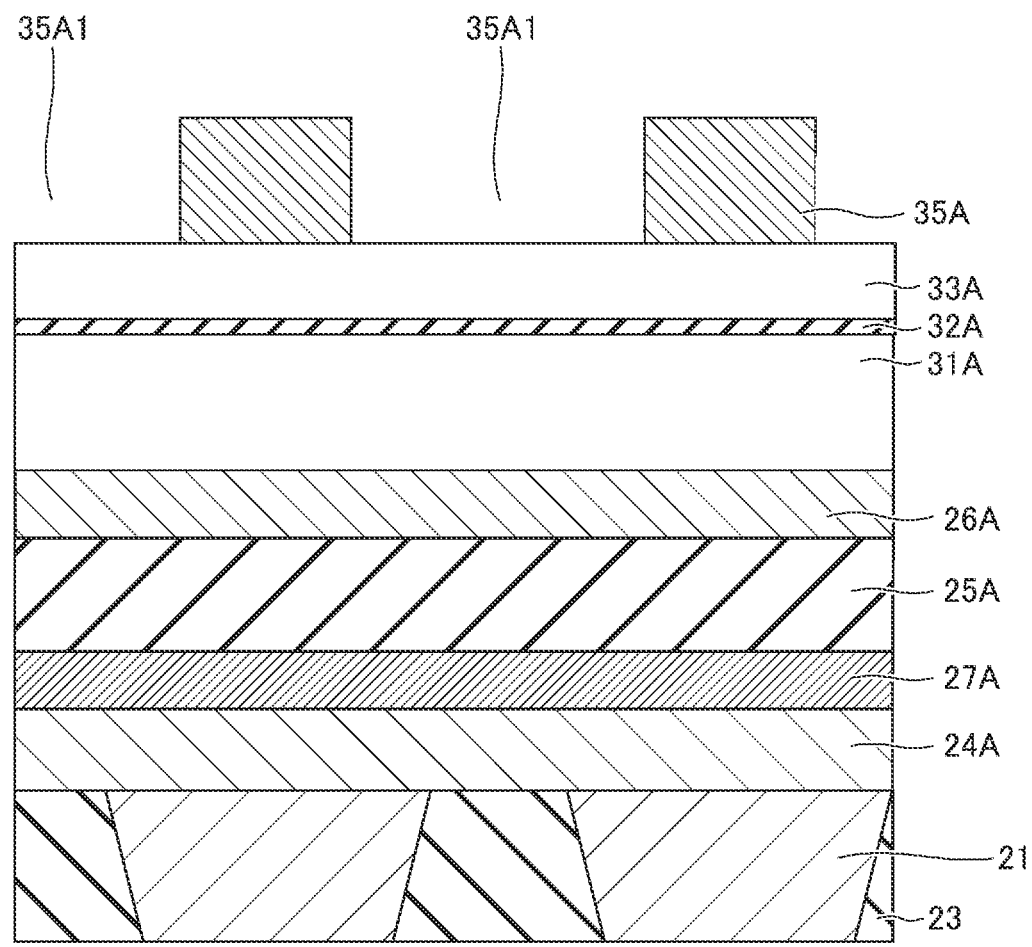
FIG. 7 illustrates an example of a sectional structure of part of the magnetoresistance memory device according to the first embodiment, which is in production.
Figure 7:
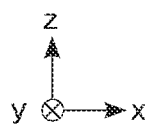

In step S11, as shown in FIG. 7, a conductor 21, an interlayer insulator 23, a lower electrode 24A, a barrier layer 27A, a variable resistance material 25A, an upper electrode 26A, a ferromagnetic layer 31A, an insulating layer 32A, a ferromagnetic layer 33A and a hard mask 35A are formed. Specifically, first, a plurality of conductors 21 are formed in the interlayer insulator 23. Then, a lower electrode 24A, a barrier layer 27A, a variable resistance material 25A, an upper electrode 26A, a ferromagnetic layer 31A, an insulating layer 32A, a ferromagnetic layer 33A and a hard mask 35A are deposited in this order on the upper surface of the interlayer insulator 23 and the upper surface of the conductor 21.

The lower electrode 24A and upper electrode 26A are formed by physical vapor deposition (PVD), for example. The variable resistance material 25A is formed by chemical vapor deposition (CVD), for example.

The lower electrode 24A, barrier layer 27A, variable resistance material 25A, upper electrode 26A, ferromagnetic layer 31A, insulating layer 32A and ferromagnetic layer 33A are components that are to be formed by later processes into a lower electrode 24, a barrier layer 27, a variable resistance material 25, an upper electrode 26, a ferromagnetic layer 31, an insulating layer 32 and a ferromagnetic layer 33, respectively.

The hard mask 35A remains just above a region where the magnetoresistance element VR is to be formed and has an opening 35A1 in the other region. The opening 35A1 extends from the upper surface of the hard mask 35A to the lower surface thereof.

The spacing of the memory cells MC depends on the area of the opening 35A1. The area of the opening 35A1 is very small for the purpose of high-density arrangement of the memory cells MC.

Figure 8:
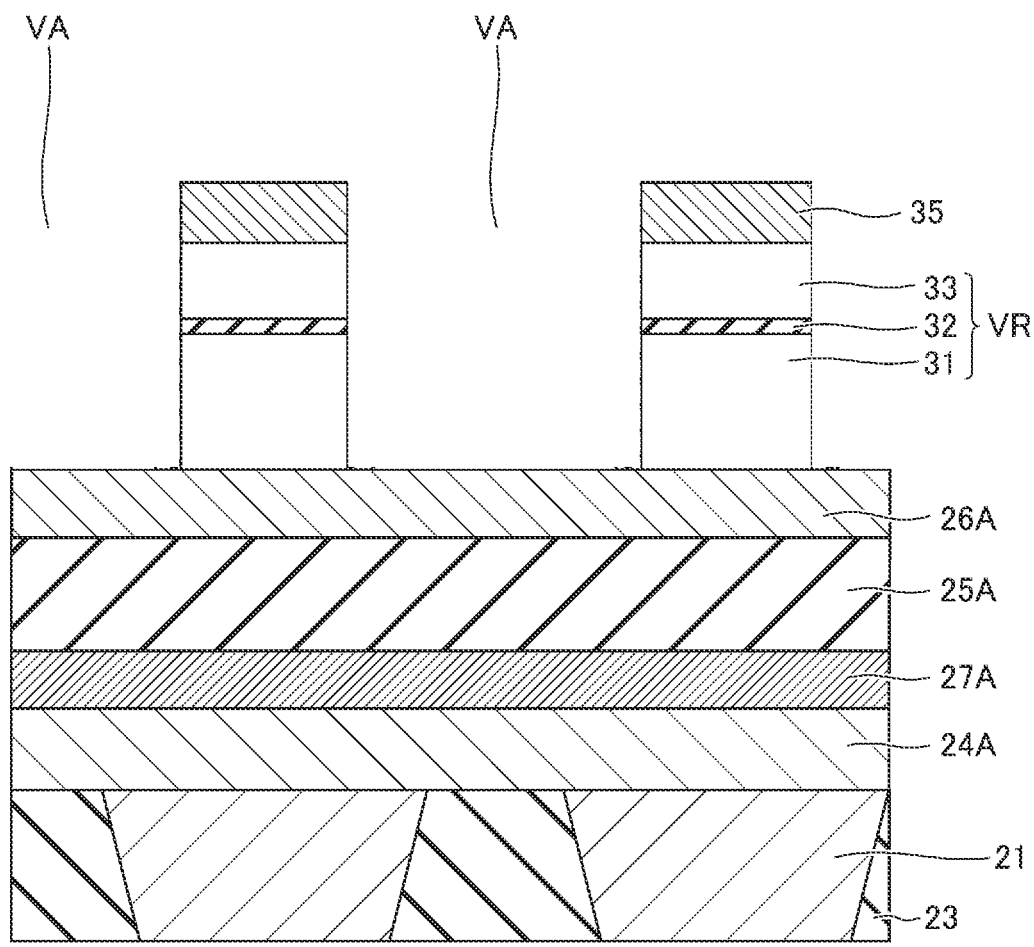
FIG. 8 illustrates an example of a sectional structure of part of the magnetoresistance memory device according to the first embodiment, which is in production.

In step S12, as shown in FIG. 8, a plurality of sets of ferromagnetic layer 31, insulating layer 32 and ferromagnetic layer 33 are formed. Specifically, the structures obtained in the previous steps are partially removed by ion beam etching (IBE). The ion beams have an angle to the z-axis. The ion beams enter the hard mask 35A through the opening 35A1 to partially remove a component exposed in the opening 35A1. Some of the ion beams are blocked by the hard mask 35A and, in other words, they do not reach a deep region in the opening 35A1 due to the shadowing effect of the hard mask 35A. However, the hard mask 35A is also partially removed by the IBE, and the upper surface of the hard mask 35A gradually lowers as the IBE progresses. As the IBE progresses, the ion beams reach a deeper region in the opening 35A1. The IBE continues at least until the ferromagnetic layer 31A, insulating layer 32A and ferromagnetic layer 33A are partially removed to form a plurality of sets of ferromagnetic layer 31, insulating layer 32 and ferromagnetic layer 33. The IBE is performed by rotating a target structure around the z-axis. Thus, as the IBE progresses, the edges of the xy-plane of an element exposed to etching approach equally toward the center of the target structure. With the IBE, the upper surface of the upper electrode 26A is partially exposed between structures, which may be referred to as a cell layer stack, each including a set of hard mask 35A, ferromagnetic layer 31, insulating layer 32 and ferromagnetic layer 33.

If the ion beams have an angle to the z-axis, the cell layer stack may have a tapered shape on its side surface. The cell layer stack may have a width at the lower end which is greater than a width at the upper end.

Figure 9:
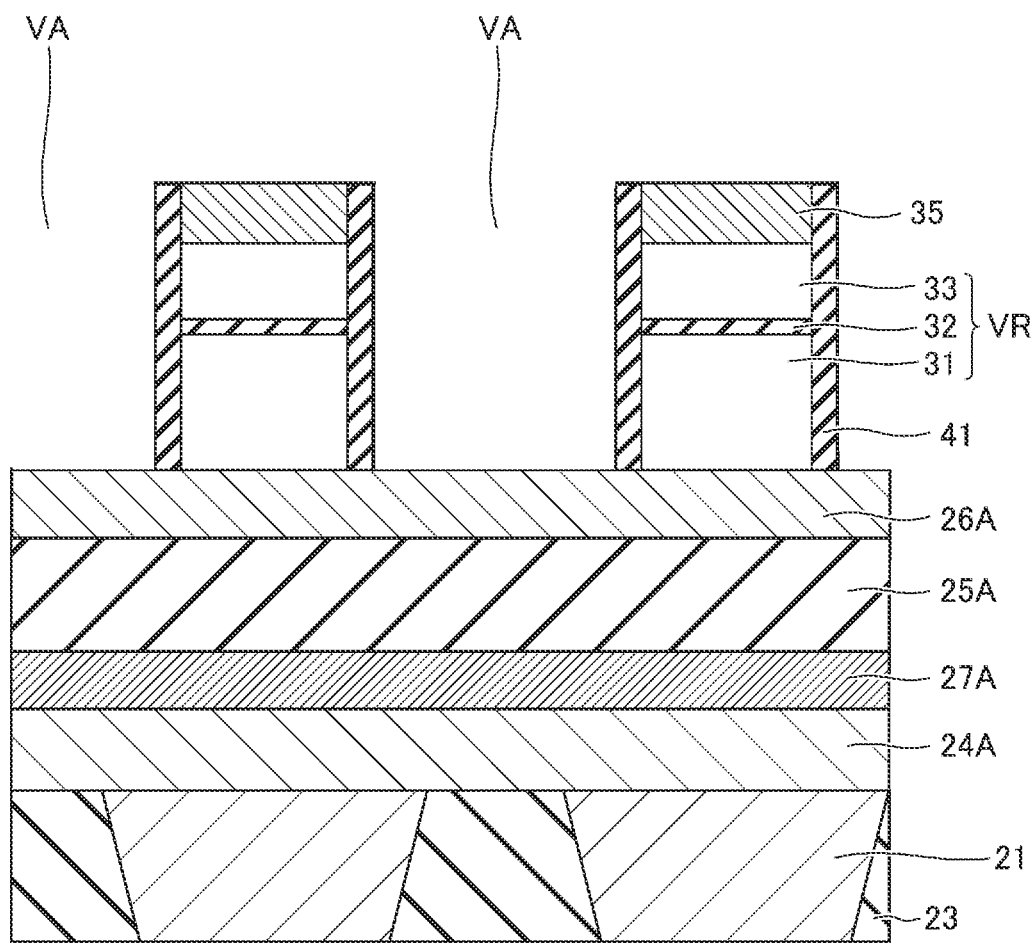
FIG. 9 illustrates an example of a sectional structure of part of the magnetoresistance memory device according to the first embodiment, which is in production.

In step S13, a sidewall insulator 41 is formed as shown in FIG. 9. Specifically, an insulator 41A is deposited all over the upper surface of the structure obtained in the previous steps. The insulator 41A is a component that is to be formed into the sidewall insulator 41 in a later step. The insulator 41A covers the exposed portion of the upper surface of the upper electrode 26A, the side surface of the cell layer stack (or, side surface of each of the ferromagnetic layer 31, insulating layer 32, ferromagnetic layer 33 and hard mask 35A), and the upper surface of the hard mask 35A.

Then, the insulator 41A is etched back. With the etch-back, portions of the insulator on the exposed portion of the upper surface of the upper electrode 26A and on the upper surface of the hard mask 35A are removed. As a result, a portion of the upper surface of the upper electrode 26A between the memory cells MC is exposed. With the etch-back, furthermore, the side surface of each of the ferromagnetic layer 31, insulating layer 32, ferromagnetic layer 33 and hard mask 35A in the insulator 41A is partially thinned.

Figure 10:
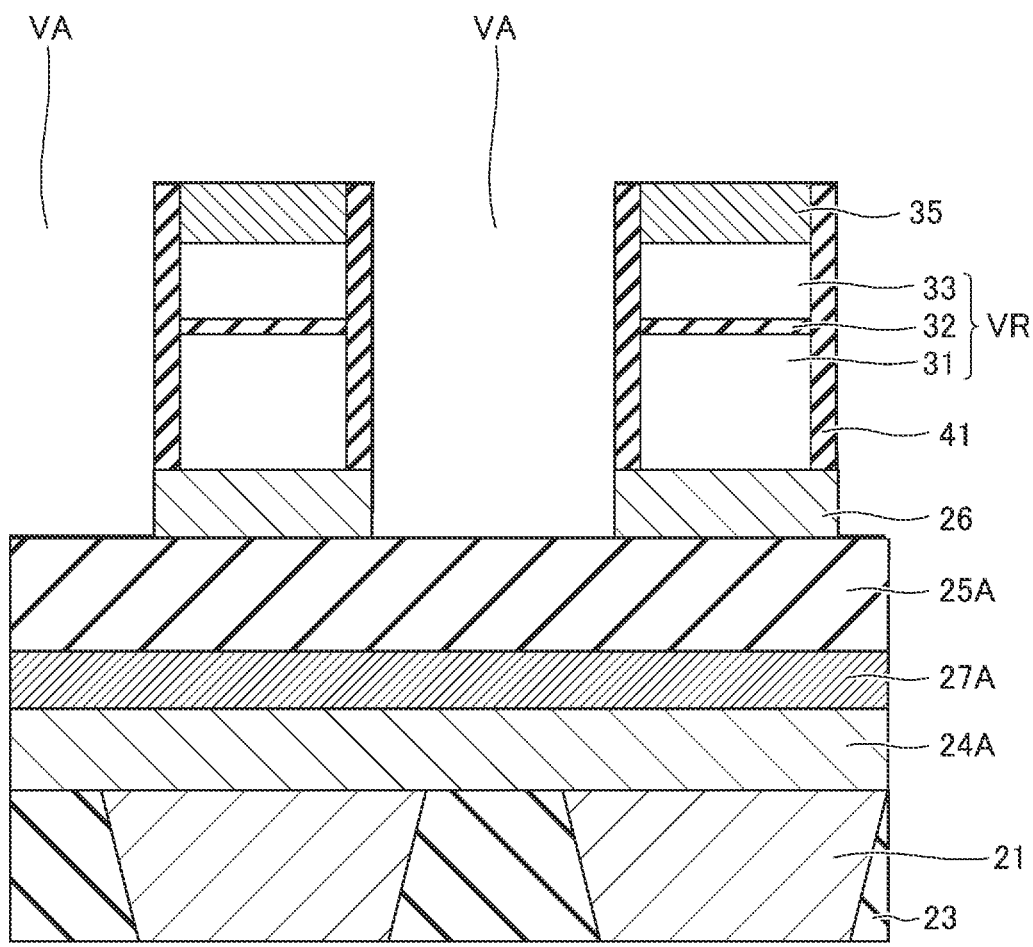
FIG. 10 illustrates an example of a sectional structure of part of the magnetoresistance memory device according to the first embodiment, which is in production.

In step S14, an upper electrode 26 is formed as shown in FIG. 10. Specifically, the upper electrode 26A is partially removed by IBE, for example. The ion beams enter a region VA to partially remove an element exposed in the region VA. The IBE continues at least until the upper electrode 26A is partially removed and the upper surface of the variable resistance material 25B is partially exposed. For example, the side surface of the upper electrode 26 is aligned with that of the sidewall insulator 41.

Figure 11:
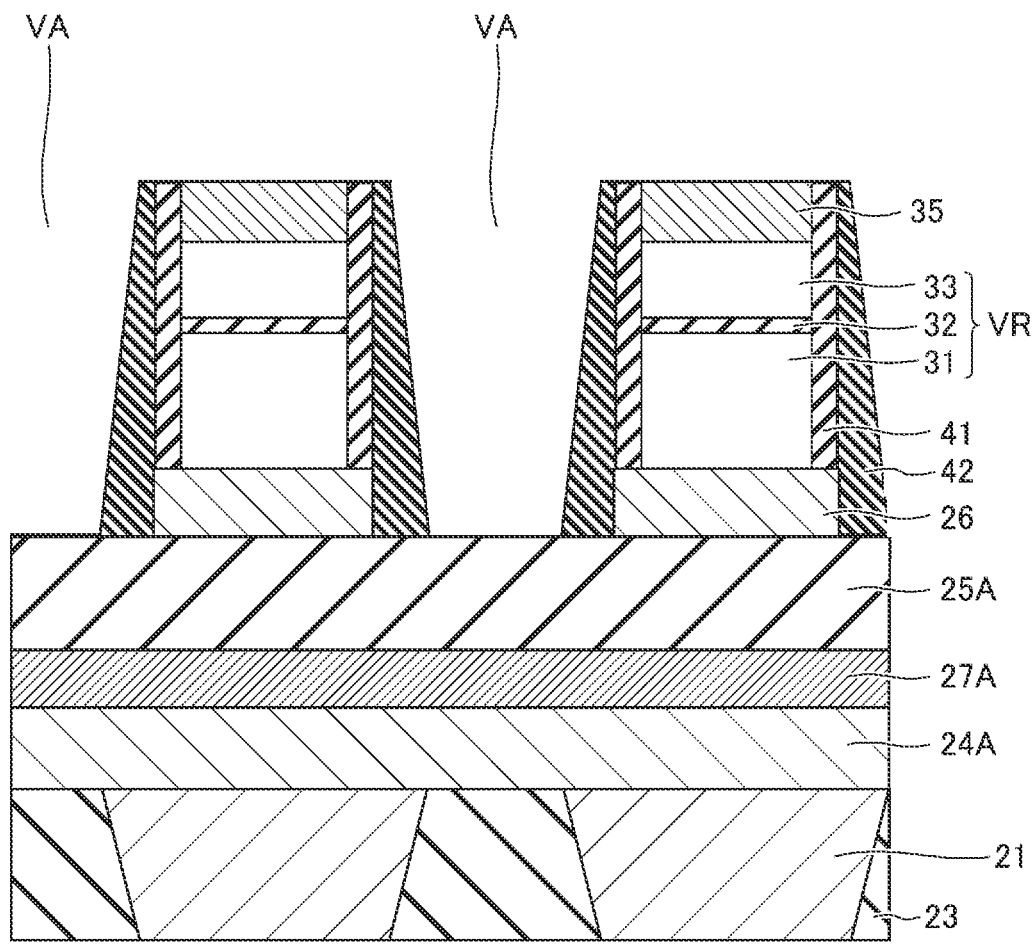
FIG. 11 illustrates an example of a sectional structure of part of the magnetoresistance memory device according to the first embodiment, which is in production.

In step S15, a sidewall insulator 42 is formed as shown in FIG. 11. Specifically, an insulator 42A is deposited all over the upper surface of the structure obtained in the previous steps. The insulator 42A is a component that is to be formed into the sidewall insulator 42 in a later step. The insulator 42A covers the exposed portion of the upper surface of the variable resistance material 25A, the side surface of the sidewall insulator 41 and the side surface of the upper electrode 26.

Then, the insulator 42A is etched back. With the etch-back, portions of the insulator 42A on the exposed portion of the upper surface of the variable resistance material 25A and on the upper surface of the hard mask 35A are removed. As a result, a portion of the upper surface of the variable resistance material 25A between the memory cells MC is exposed. With the etch-back, portions of the insulator 42A on the side surface of each of the sidewall insulator 41 and upper electrode 26 is thinned.

Figure 12:
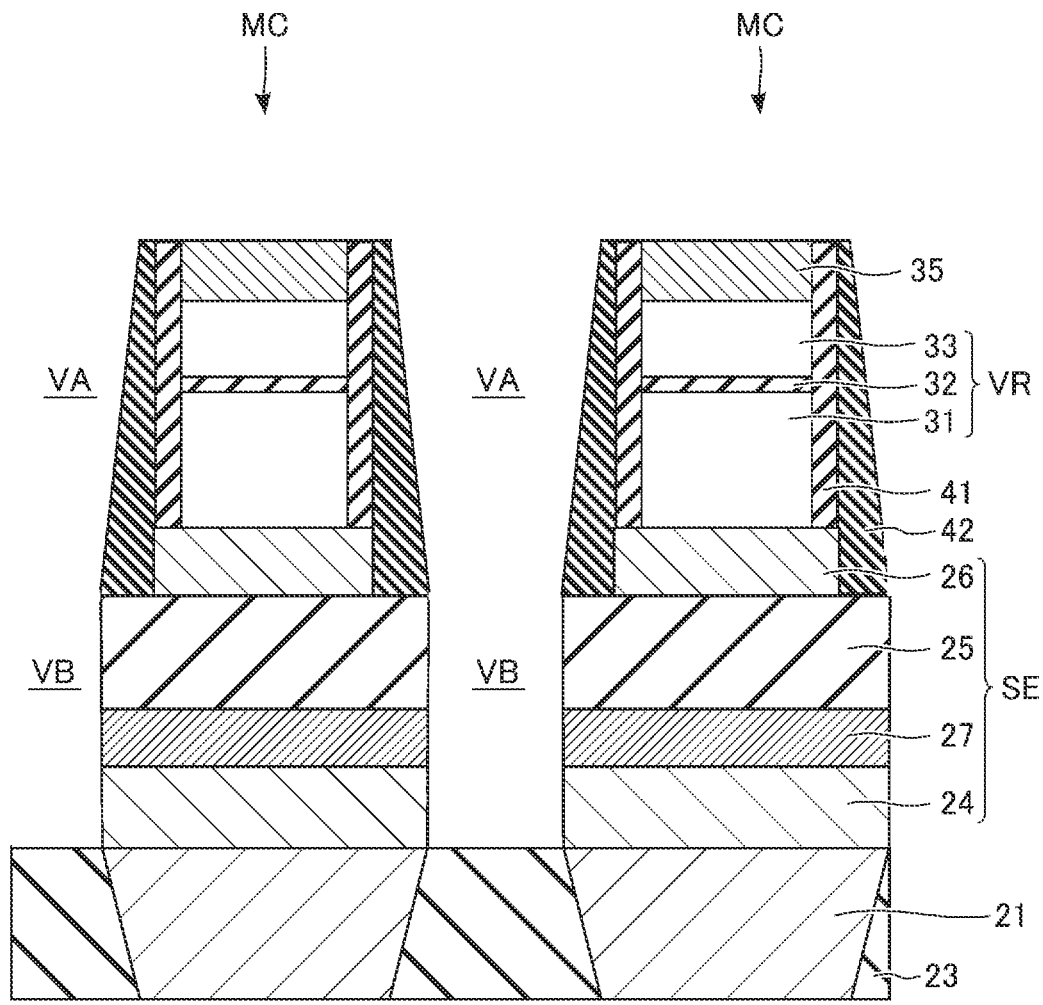
FIG. 12 illustrates an example of a sectional structure of part of the magnetoresistance memory device according to the first embodiment, which is in production.

In step S16, a plurality of sets of variable resistance material 25, barrier layer 27 and lower electrode 24 are formed as shown in FIG. 12. RIE is performed on the structure obtained by the previous steps. Ions of the RIE enter a region VA between the cell layer stacks to remove the upper surface of the variable resistance material 25. As the RIE progresses, it further partially removes the variable resistance material 25, barrier layer 27 and lower electrode 24 below the region VA.

In the RIE, the structure above the variable resistance material 25A (cell layer stack, sidewall insulator 41, sidewall insulator 42 and upper electrode 26) serves as a mask. The RIE continues until an opening is formed to extend from the upper surface to the lower surface of the lower electrode 24A below the region VA.

With the RIE, the variable resistance material 25, barrier layer 27 and lower electrode 24 are molded. The molding results in forming a plurality of sets of variable resistance material 25, barrier layer 27 and lower electrode 24 as well as forming a region VB below the region VA. The set of the upper electrode 26, variable resistance material 25, barrier layer 27 and lower electrode 24 may be referred to hereafter as a switching element layer stack. The switching element layer stack is located below the cell layer stack.

The width or diameter of the opening in the region VB (i.e., the width or diameter at the same level as the upper surface of the variable resistance material 25) is equal to the spacing of the lower edges of adjacent cell layer stacks (or the width or diameter of the lower edge of the region VA). As described above, the spacing between the lower edges of adjacent cell layer stacks may be narrow. Thus, the opening of the region VB may be very narrow.

The RIE is isotropic. However, because the opening of the region VB is narrow and the ratio of the opening to the thickness of the set of variable resistance material 25, barrier layer 27 and lower electrode 24, which are the subjects of RIE, is small, the side surface of the switching element layer stack may be tapered. That is, the distance between the lower edges of the region VB, i.e., the distance between the lower edges of adjacent switching element layer stacks, may be less than the distance between the lower edges of the region VA, i.e., the upper edges of adjacent switching element layer stacks.

Figure 13:
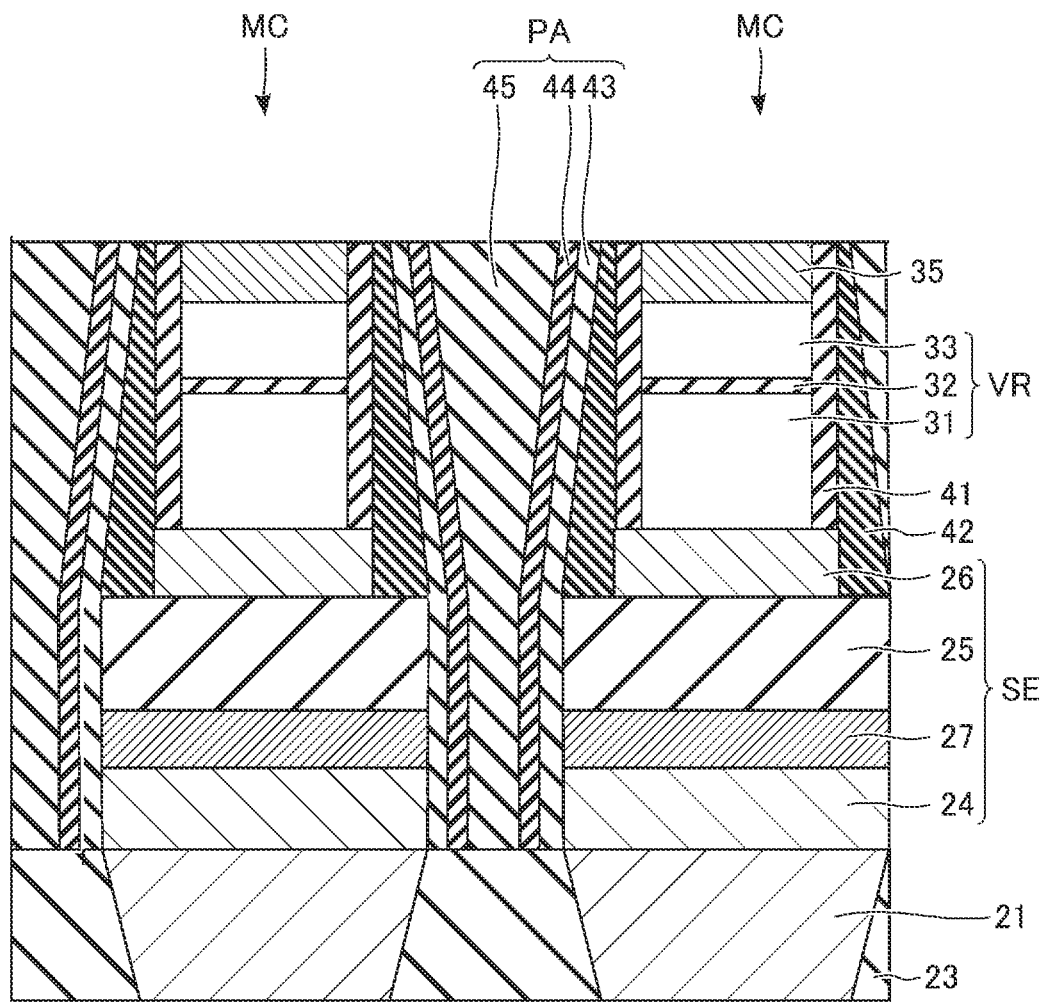
FIG. 13 illustrates an example of a sectional structure of part of the magnetoresistance memory device according to the first embodiment, which is in production.

In step S17, in that part of a region from the upper surface of the interlayer insulator 23 to the upper surface of the hard mask 35 where no element is provided, an interlayer insulator PA is formed, as shown in FIG. 13. In other words, interlayer insulators 43 to 45 are formed in the regions VA and VB. Specifically, first, an interlayer insulator 43 is formed on the side surfaces of the sidewall insulator 42, variable resistance material 25, barrier layer 27 and lower electrode 24. Then, an interlayer insulator 44 is formed on the side surface of the interlayer insulator 43. Then, an interlayer insulator 45 is embedded between adjacent interlayer insulators 44.

After that, as shown in FIG. 5, a conductor 22 is formed on the upper surface of the interlayer insulator PA and that of the hard mask 35.

<1-3> Advantages (Advantageous Effects) of First Embodiment

The magnetoresistance memory device 1 according to the first embodiment described above makes it possible to improve the performance of the switching element SE and/or the magnetoresistance effect element VR. Below is a detailed description of the advantageous effects of the magnetoresistance memory device 1 according to the first embodiment.

First, the magnetoresistance memory device 1 according to the first embodiment can improve the thermal insulation of the switching element SE. When a current flows in the magnetoresistance memory device 1, it generates Joule heat. The Joule heat is generated especially in the variable resistance material 25 of the switching element SE. If the Joule heat generated in the variable resistance material 25 leaks to areas other than the switching element SE, such as the magnetoresistance effect element VR, the performance of the magnetoresistance memory device 1 can be degraded.

The magnetoresistance memory device 1 according to the first embodiment includes the upper and lower electrodes 26 and 24 with heat insulating performance. Specifically, as described above, the upper and lower electrodes 26 and 24 contain or substantially consist of a-C or a-CN, which is a material having a heat insulating effect. That is, the upper and lower electrodes 26 and 24 can prevent the Joule heat generated in the variable resistance material 25 from leaking out of the switching element SE. In addition, a high-resistance material can be used as a material with a heat insulating effect. Also, C of the a-CN is difficult to diffuse into the variable resistance material 25.

The magnetoresistance memory device 1 according to the first embodiment may further improve in heat insulating effect because it includes the interlayer insulator PA. As described above, the interlayer insulators 43 to 45 respectively contains or substantially consists of SiN, SiO$_2$ and SiN. Alternatively, the interlayer insulators 43 to 45 respectively contains or substantially consists of SiO$_2$, SiN and SiO$_2$. The interlayer insulator PA having such a structure may prevent the Joule heat generated in the variable resistance material 25 from leaking out of the switching element SE.

Furthermore, the magnetoresistance memory device 1 according to the first embodiment includes the barrier layer 27 under the variable resistance material 25. If the variable resistance material 25 is formed on the lower electrode 24, such a structure cannot be formed by the CVD process. This is because carbon (C) is volatilized from the lower electrode 24 if the CVD process is performed with the lower electrode 24 exposed. In the magnetoresistance memory device 1, therefore, carbon (C) can be prevented from being volatilized by providing the barrier layer 27 under the variable resistance material 25. That is, the magnetoresistance memory device 1 makes it possible to form the variable resistance material 25 using the CVD process while including the lower electrode 24 containing a-C or a-CN.

Since, furthermore, the magnetoresistance memory device 1 according to the first embodiment includes the sidewall insulator 41, it can prevent C from entering the magnetoresistance effect element unintentionally. If the upper electrode 26A is also subjected to IBE at the same time in step S12, for example, the C contained in the upper electrode 26A could be redeposited on the sidewalls of the ferromagnetic layer 31, insulating layer 32 and/or ferromagnetic layer 33. In the magnetoresistance memory device 1, no IBE is performed on the upper electrode 26A in step S12, but the sidewall insulator 41 is provided on the sidewalls of the ferromagnetic layer 31, insulating layer 32 and ferromagnetic layer 33 (step S13) and then the upper electrode 26A is subjected to IBE (step S14). With this manufacturing method, the magnetoresistance memory device 1 may include the sidewall insulator 41, that is, C can be prevented from being mixed into the magnetoresistance effect element VR.

<2> Other Modification, etc

In the forgoing magnetoresistance memory device 1 according to the first embodiment, the magnetoresistance effect element VR of the memory cell MC is provided above the switching element SE. However, the magnetoresistance memory device 1 is not limited to this structure, but the magnetoresistance effect element VR may be provided below the switching element SE.

Figure 14:
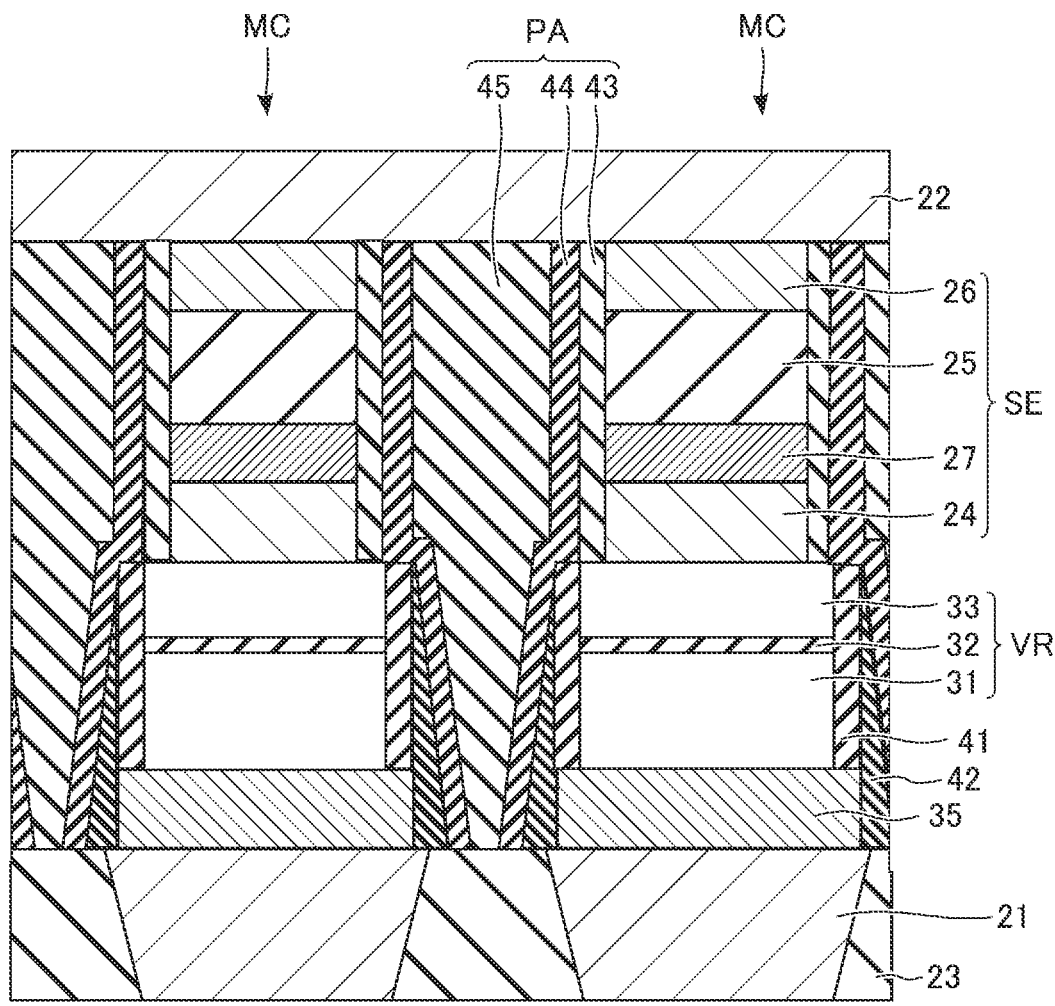
FIG. 14 illustrates an example of a sectional structure of a memory cell of the magnetoresistance memory device according to the first embodiment.

FIG. 14 is a sectional view showing an example of the structure of a memory cell of a magnetoresistance memory device 1b according to a variation to the first embodiment. FIG. 14 shows a region similar to that shown in FIG. 5. Like the memory cell of the magnetoresistance memory device 1, each memory cell MC of the magnetoresistance memory device 1b includes a switching element SE, a magnetoresistance effect element VR, a hard mask 35 and sidewall insulators 41 and 42, as shown in FIG. 14. The memory cell MC may further include a layer.

The hard mask 35 is located on the upper surface of the conductor 21.

A single magnetoresistance effect element VR is located on the upper surface of the hard mask 35. Like in the magnetoresistance memory device 1, the magnetoresistance effect element VR of the magnetoresistance memory device 1b includes a ferromagnetic layer 31, an insulating layer 32 and a ferromagnetic layer 33. The insulating layer 32 is located on the upper surface of the ferromagnetic layer 31, and the ferromagnetic layer 33 is located on the upper surface of the insulating layer 32.

The magnetoresistance effect element VR may further include a layer.

The switching element SE includes at least a lower electrode 24, a barrier layer 27, a variable resistance material (layer) 25 and an upper electrode 26. The lower electrode 24 is located on the upper surface of the ferromagnetic layer 33. The barrier layer 27 is located on the upper surface of the lower electrode 24. The variable resistance material 25 is located on the upper surface of the barrier layer 27. The upper electrode 26 is located on the upper surface of the variable resistance material 25.

The side surface of the magnetoresistance effect element VR is covered with the sidewall insulator 41. The side surfaces of the hard mask 35 and sidewall insulator 41 are covered with the sidewall insulator 42.

A conductor 22 is located on the upper surface of the upper electrode 26 of each of the memory cells MC arranged along the y-axis.

In that part of a region from the upper surface of the interlayer insulator 23 to the upper surface of the upper electrode 26 where no element is provided, an interlayer insulator PA is provided. In other words, an interlayer insulator PA is provided between two adjacent memory cells MC. The interlayer insulator PA includes interlayer insulators 43 to 45. The interlayer insulator 43 is provided on the side surface of the switching element SE. The interlayer insulator 44 is provided on the side surfaces of the interlayer insulator 43, sidewall insulator 41 and sidewall insulator 42. The interlayer insulator 45 is embedded between adjacent interlayer insulators 44.

Since the materials of elements of the magnetoresistance memory device 1b described above are similar to those of elements of the magnetoresistance memory device 1, their descriptions will be omitted.

Like the magnetoresistance memory device 1, the magnetoresistance memory device 1b according to the modification to the first embodiment can improve the performance of the switching element SE and/or the magnetoresistance effect element VR. Specifically, the upper and lower electrodes 26 and 24 including a-C or a-CN can improve the thermal insulation of the switching element SE.

In addition, the interlayer insulator PA of the magnetoresistance memory device 1b according to the modification can further improve the thermal insulation effect.

In addition, the magnetoresistance memory device 1b according to the modification makes it possible to form a variable resistance material 25 using the CVD process while having a lower electrode 24 including a-C or a-CN.

Since, furthermore, the magnetoresistance memory device 1b according to the modification includes the sidewall insulator 41, it can prevent the elements contained in the hard mask 35 from being mixed into the magnetoresistance effect element VR.

In the present specification, the word "coupled" refers to "electrically coupled" and does not exclude, for example, a component interposed between two other components coupled to each other. The "electrically coupled" may mean that two components are electrically coupled to each other via an insulator if the insulator can be operated in the same manner as the electrically coupled components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistance memory device comprising:
    a lower electrode containing one of amorphous carbon and amorphous carbon nitride;
    a barrier layer provided on the lower electrode and containing one of tungsten nitride (WN) and silicon tungsten nitride (WSiN);
    a variable resistance layer provided on the barrier layer and containing a variable resistance material;
    an upper electrode provided on the variable resistance layer and containing one of amorphous carbon and amorphous carbon nitride;
    a first layer stack provided on the upper electrode and including a first ferromagnetic layer, a second ferromagnetic layer, and an insulating layer between the first ferromagnetic layer and the second ferromagnetic layer;
    a first insulator on a side surface of the first layer stack and on a side surface of the upper electrode; and
    a second insulator between the first layer stack and the first insulator.

2. The magnetoresistance memory device of claim 1, wherein:
    the second insulator covers the side surface of the first layer stack; and
    the first insulator covers a side surface of the second insulator and the side surface of the upper electrode.

3. The magnetoresistance memory device of claim 1, wherein the first insulator contains one of hafnium oxide, aluminum oxide, scandium oxide, gadolinium oxide, tantalum oxide and yttrium oxide.

4. The magnetoresistance memory device of claim 1, further comprising:
    a third insulator on side surfaces of the first insulator, the lower electrode, the barrier layer and the variable resistance layer;
    a fourth insulator on a side surface of the third insulator; and
    a fifth insulator on a side surface of the fourth insulator, wherein:
    the third insulator and the fifth insulator each contain silicon oxide; and
    the fourth insulator contains silicon nitride.

5. The magnetoresistance memory device of claim 1, further comprising:
    a third insulator on side surfaces of the first insulator, the lower electrode, the barrier layer and the variable resistance layer;
    a fourth insulator on a side surface of the third insulator; and
    a fifth insulator on a side surface of the fourth insulator, wherein:
    the third insulator and the fifth insulator each contain silicon nitride; and
    the fourth insulator contains silicon oxide.

6. The magnetoresistance memory device of claim 1, further comprising:
    a third insulator on side surfaces of the lower electrode, the barrier layer, the variable resistance layer, the upper electrode and the first layer stack;
    a fourth insulator on a side surface of the third insulator; and
    a fifth insulator on a side surface of the fourth insulator, wherein:
    the third insulator and the fifth insulator each contain silicon oxide; and
    the fourth insulator contains silicon nitride.

7. The magnetoresistance memory device of claim 1, further comprising:
    a third insulator on side surfaces of the lower electrode, the barrier layer, the variable resistance layer, the upper electrode and the first layer stack;
    a fourth insulator on a side surface of the third insulator; and
    a fifth insulator on a side surface of the fourth insulator, wherein:
    the third insulator and the fifth insulator each contain silicon nitride; and
    the fourth insulator contains silicon oxide.

8. A magnetoresistance memory device comprising:
a first layer stack including a first ferromagnetic layer, a second ferromagnetic layer, and an insulating layer between the first ferromagnetic layer and the second ferromagnetic layer;
a lower electrode provided on the first layer stack and containing one of amorphous carbon and amorphous carbon nitride;
a barrier layer provided on the lower electrode and containing one of WN and WSiN;
a variable resistance layer provided on the barrier layer and containing a variable resistance material;
an upper electrode provided on the variable resistance layer and containing one of amorphous carbon and amorphous carbon nitride; and
a first insulator on a side surface of the first layer stack.

9. The magnetoresistance memory device of claim 8, wherein the first insulator covers the side surface of the first layer stack.

10. The magnetoresistance memory device of claim 8, further comprising:
a third insulator on side surfaces of the lower electrode, the barrier layer, the variable resistance layer and the upper electrode;
a fourth insulator on side surfaces of the third insulator and the first insulator; and
a fifth insulator on a side surface of the fourth insulator, wherein:
the third insulator and the fifth insulator each contain silicon oxide; and
the fourth insulator contains silicon nitride.

11. The magnetoresistance memory device of claim 8, further comprising:
a third insulator on side surfaces of the lower electrode, the barrier layer, the variable resistance layer and the upper electrode;
a fourth insulator on side surfaces of the third insulator and the first insulator; and
a fifth insulator on a side surface of the fourth insulator, wherein:
the third insulator and the fifth insulator each contain silicon nitride; and
the fourth insulator contains silicon oxide.

12. A method for manufacturing a magnetoresistance memory device, comprising:
forming a lower electrode containing one of amorphous carbon and amorphous carbon nitride;
forming on the lower electrode a barrier layer containing one of WN and WSiN;
forming on the barrier layer a variable resistance layer containing a variable resistance material by a chemical vapor deposition process;
forming on the variable resistance layer an upper electrode containing one of amorphous carbon and amorphous carbon nitride;
forming on the upper electrode a first layer stack including a first ferromagnetic layer, a second ferromagnetic layer, and an insulating layer between the first ferromagnetic layer and the second ferromagnetic layer;
partially removing the first layer stack by etching;
forming a first insulator on a side surface of the first layer stack;
partially removing the upper electrode by etching; and
forming a second insulator on side surfaces of the first insulator and the upper electrode.

13. The method of claim 12, wherein the second insulator includes a first material whose etching rate is lower than etching rate of each of the lower electrode, the barrier layer, the variable resistance layer and the upper electrode.

14. The method of claim 12, further comprising:
forming a third insulator on side surfaces of the second insulator, the lower electrode, the barrier layer and the variable resistance layer;
forming a fourth insulator on a side surface of the third insulator; and
forming a fifth insulator on a side surface of the fourth insulator,
wherein:
the third insulator and the fifth insulator each contain silicon oxide; and
the fourth insulator contains silicon nitride.

15. The method of claim 12, further comprising:
forming a third insulator on side surfaces of the second insulator, the lower electrode, the barrier layer and the variable resistance layer;
forming a fourth insulator on a side surface of the third insulator; and
forming a fifth insulator on a side surface of the fourth insulator,
wherein:
the third insulator and the fifth insulator each contain silicon nitride; and
the fourth insulator contains silicon oxide.

* * * * *